United States Patent
Edelstein et al.

(10) Patent No.: US 10,115,670 B2
(45) Date of Patent: Oct. 30, 2018

(54) FORMATION OF ADVANCED INTERCONNECTS INCLUDING SET OF METAL CONDUCTOR STRUCTURES IN PATTERNED DIELECTRIC LAYER

(71) Applicant: International Business Machines Corporation, Armonk, NY (US)

(72) Inventors: Daniel C. Edelstein, White Plains, NY (US); Chih-Chao Yang, Glenmont, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/239,198

(22) Filed: Aug. 17, 2016

(65) Prior Publication Data

US 2018/0053725 A1 Feb. 22, 2018

(51) Int. Cl.
*H01L 21/76* (2006.01)
*H01L 21/28* (2006.01)
(Continued)

(52) U.S. Cl.
CPC .... *H01L 23/53209* (2013.01); *H01L 21/2855* (2013.01); *H01L 21/28568* (2013.01);
(Continued)

(58) Field of Classification Search
CPC ......... H01L 23/53209; H01L 21/76846; H01L 21/76858; H01L 21/76877; H01L 21/2855; H01L 21/28568; H01L 21/76855; H01L 21/7684; H01L 21/3212; H01L 23/5226; H01L 23/53238; H01L 23/53252;
(Continued)

(56) References Cited

U.S. PATENT DOCUMENTS 5,566,045 A 10/1996 Summerfelt
6,013,581 A 1/2000 Wu
(Continued)

FOREIGN PATENT DOCUMENTS

KR 1020050122629 A 12/2005
KR 1020060072415 A 6/2006
(Continued)

OTHER PUBLICATIONS

IBM Patents or Patent Applications Treated As Related.
Barlet DeProspo, Fundamental Interdiffusion Analysis of Ruthenium and Cobalt Films, May 11, 2016.

*Primary Examiner* — Didarul Mazumder
(74) *Attorney, Agent, or Firm* — Jeffrey S LaBaw; Steven J Meyers

(57) ABSTRACT

A pattern is provided in a dielectric layer. The pattern includes a set of features in the dielectric for a set of metal conductor structures. The set of features have a first dimension. An adhesion promoting layer disposed over the patterned dielectric is deposited. A ruthenium layer disposed over the adhesion promoting layer is deposited. A cobalt layer is deposited over the ruthenium layer. A high temperature thermal anneal is performed which creates a ruthenium cobalt alloy layer to cover surfaces of the set of features. A metal layer is deposited disposed over the ruthenium cobalt alloy layer to form a set of metal conductor structures. In another aspect of the invention, a device is created using the method.

15 Claims, 10 Drawing Sheets

(51) Int. Cl.
- *H01L 21/32* (2006.01)
- *H01L 23/52* (2006.01)
- *H01L 23/532* (2006.01)
- *H01L 21/768* (2006.01)
- *H01L 21/285* (2006.01)
- *H01L 23/528* (2006.01)
- *H01L 23/522* (2006.01)
- *H01L 21/321* (2006.01)

(52) U.S. Cl.
CPC ...... *H01L 21/3212* (2013.01); *H01L 21/7684* (2013.01); *H01L 21/76846* (2013.01); *H01L 21/76855* (2013.01); *H01L 21/76858* (2013.01); *H01L 21/76877* (2013.01); *H01L 23/528* (2013.01); *H01L 23/5226* (2013.01); *H01L 23/53238* (2013.01); *H01L 23/53252* (2013.01); *H01L 23/53266* (2013.01); *H01L 21/76856* (2013.01); *H01L 23/53247* (2013.01); *H01L 23/53261* (2013.01)

(58) Field of Classification Search
CPC ............. H01L 23/53266; H01L 23/528; H01L 23/53247; H01L 21/768
USPC .......................... 257/752; 438/626, 631, 645
See application file for complete search history.

(56) References Cited

U.S. PATENT DOCUMENTS

| | | | |
|---|---|---|---|
| 6,107,687 A | 8/2000 | Tetsuo et al. | |
| 6,143,645 A | 11/2000 | Hsu | |
| 6,150,257 A | 11/2000 | Yin | |
| 6,239,494 B1 | 5/2001 | Besser et al. | |
| 6,265,260 B1 | 7/2001 | Alers | |
| 6,562,711 B1 | 5/2003 | Powers | |
| 6,605,535 B1 | 8/2003 | Lee | |
| 6,780,758 B1 | 8/2004 | Derderian | |
| 6,787,446 B2 | 9/2004 | Enomoto et al. | |
| 6,900,539 B2 | 5/2005 | Motoyama | |
| 6,903,016 B2 | 6/2005 | Cohen | |
| 6,924,226 B2 | 8/2005 | Cohen | |
| 6,933,609 B2 | 8/2005 | Narukawa | |
| 6,964,874 B2 | 11/2005 | Werner | |
| 7,084,063 B2 | 8/2006 | Noguchi | |
| 7,105,434 B2 | 9/2006 | Cohen | |
| 7,193,327 B2 | 3/2007 | Yu et al. | |
| 7,670,646 B2 | 3/2010 | Ahn et al. | |
| 7,998,859 B2 | 8/2011 | Chen et al. | |
| 8,435,887 B2 | 5/2013 | Kelly et al. | |
| 8,586,473 B1 | 11/2013 | Tanwar | |
| 9,111,939 B2 | 8/2015 | Gstrein | |
| 9,177,858 B1 | 11/2015 | Zhang | |
| 9,330,939 B2 | 5/2016 | Zope et al. | |
| 2002/0022357 A1 | 2/2002 | Iijima | |
| 2004/0157391 A1 | 8/2004 | Park | |
| 2004/0235298 A1* | 11/2004 | Inoue | C23C 18/48 438/687 |
| 2006/0094236 A1 | 5/2006 | Elkins | |
| 2006/0113675 A1 | 6/2006 | Chang | |
| 2007/0072415 A1 | 3/2007 | Suzuki | |
| 2008/0008920 A1* | 1/2008 | Alexandrovichserov | H01M 4/8626 429/483 |
| 2010/0295181 A1* | 11/2010 | Yang | H01L 21/76843 257/751 |
| 2010/0314768 A1 | 12/2010 | Darnon | |
| 2012/0252207 A1* | 10/2012 | Lei | H01L 21/76885 438/653 |
| 2012/0326311 A1 | 12/2012 | Yang | |
| 2013/0127055 A1 | 5/2013 | Chen | |
| 2013/0168863 A1* | 7/2013 | Yang | H01L 21/3105 257/751 |
| 2013/0260555 A1 | 10/2013 | Zope | |
| 2014/0183738 A1 | 7/2014 | Jezewski | |
| 2014/0183743 A1 | 7/2014 | Matsumoto | |
| 2014/0202746 A1 | 7/2014 | Anderson | |
| 2014/0273386 A1 | 9/2014 | Tsao | |
| 2014/0287577 A1 | 9/2014 | Emesh | |
| 2015/0179578 A1 | 6/2015 | Jezewski | |
| 2015/0203961 A1* | 7/2015 | Ha | C23C 16/045 427/124 |
| 2015/0255339 A1 | 9/2015 | Zhang | |
| 2015/0262938 A1 | 9/2015 | Lin | |
| 2015/0270133 A1 | 9/2015 | Lam | |
| 2015/0311112 A1* | 10/2015 | Fukuo | H01L 21/76802 257/773 |
| 2015/0325477 A1 | 11/2015 | Shaviv | |
| 2015/0340323 A1 | 11/2015 | Cabral et al. | |
| 2016/0056071 A1 | 2/2016 | Draeger | |
| 2016/0056112 A1 | 2/2016 | Edelstein | |
| 2016/0163591 A1 | 6/2016 | Ishizaka | |
| 2016/0307845 A1 | 10/2016 | Furuhashi | |
| 2016/0309596 A1 | 10/2016 | Shaviv | |

FOREIGN PATENT DOCUMENTS

| | | |
|---|---|---|
| TW | I502646 B | 10/2015 |
| TW | 201611121 A | 3/2016 |
| WO | 2015142745 A1 | 9/2015 |

* cited by examiner

FORMATION OF ADVANCED INTERCONNECTS INCLUDING SET OF METAL CONDUCTOR STRUCTURES IN PATTERNED DIELECTRIC LAYER

BACKGROUND OF THE INVENTION

This disclosure relates to integrated circuit devices, and more specifically, to a method and structure to create advanced metal conductor structures in semiconductor devices.

As the dimensions of modern integrated circuitry in semiconductor chips continues to shrink, conventional lithography is increasingly challenged to make smaller and smaller structures. With the reduced size of the integrated circuit, packaging the circuit features more closely together becomes important as well. By placing features closer to each other, the performance of the overall integrated circuit is improved.

However, by placing the integrated circuit features closer together, many other problems are created. One of these problems is an increase in the resistance-capacitance (RC) delay caused at least in part by the increase in copper resistivity as the dimensions of the features become smaller. The RC delay is the delay in signal speed through the circuit as the result of the resistance and capacitance of the circuit elements.

The present disclosure presents improved interconnects to alleviate this problem.

BRIEF SUMMARY

According to this disclosure, an advanced metal conductor structure and a method for constructing the structure are described. A pattern is provided in a dielectric layer. The pattern includes a set of features in the dielectric for a set of metal conductor structures. The set of features have a first dimension. An adhesion promoting layer disposed over the patterned dielectric is deposited. A ruthenium layer disposed over the adhesion promoting layer is deposited. A cobalt layer is deposited over the ruthenium layer. A high temperature thermal anneal is performed which creates a ruthenium cobalt alloy layer to cover surfaces of the set of features. A metal layer is deposited disposed over the ruthenium cobalt alloy layer to form a set of metal conductor structures. In another aspect of the invention, a device is created using the method.

The foregoing has outlined some of the more pertinent features of the disclosed subject matter. These features should be construed to be merely illustrative. Many other beneficial results can be attained by applying the disclosed subject matter in a different manner or by modifying the invention as will be described.

BRIEF DESCRIPTION OF THE DRAWINGS

For a more complete understanding of the present invention and the advantages thereof, reference is now made to the following descriptions taken in conjunction with the accompanying drawings which are not necessarily drawing to scale, and in which.

DETAILED DESCRIPTION OF THE DRAWINGS

Figure 1:
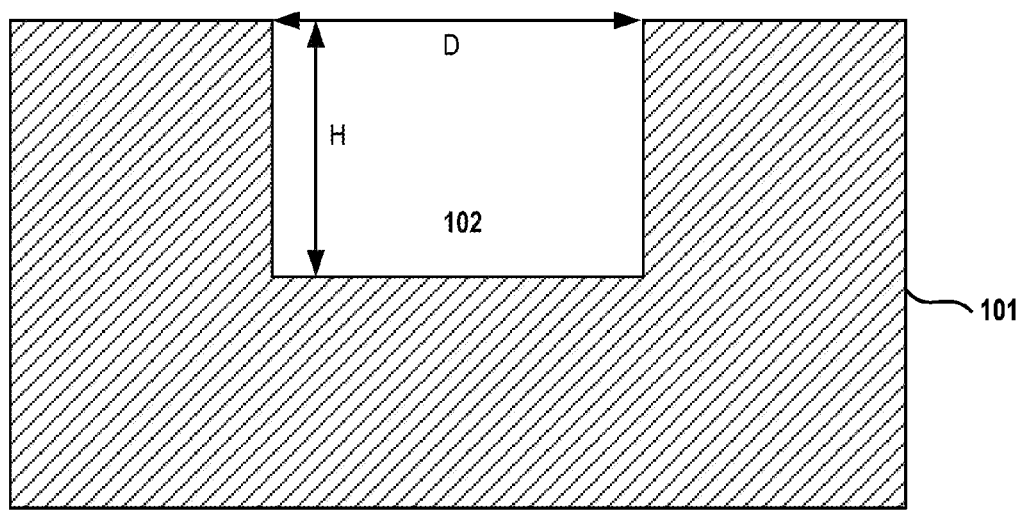
FIG. 1 is a cross-sectional diagram depicting the dielectric structure after patterning and etching steps have been performed according to a first embodiment of the invention.

At a high level, the invention provides a method and resulting structure to form interconnects which reduce resistance-capacitance (RC) delays as compared to conventional interconnects. In the invention, ruthenium and cobalt layers are used instead of copper as interconnect materials. The ruthenium/cobalt combination is chosen as cobalt has a better lattice match with ruthenium than alternative materials such as titanium or tantalum. This provides a good interface for performing a reflow process. The combination of material provides good metal fill properties in aggressively scaled features, e.g., less than twenty nanometers. With good metal fill properties, the reliability of the interconnect is also improved.

Although the bulk resistivity value of cobalt is higher than that of copper, resistance in thin films and features increases more rapidly in materials with a larger mean free path, such as copper, as compared to cobalt (Co). Thus, narrow Co features will display lower resistance than Cu features of comparable size below 30 nm or so. Accordingly, the inventors propose using Co as the bulk conductor in the current disclosure vs. Cu used in prior art devices. The lower resistance of Co in small features is expected to show RC delay benefit in narrow wires (<30 nm).

A "substrate" as used herein can comprise any material appropriate for the given purpose (whether now known or developed in the future) and can comprise, for example, Si, SiC, SiGe, SiGeC, Ge alloys, GaAs, InAs, InP, other III-V or II-VI compound semiconductors, or organic semiconductor structures. Insulators can also be used as substrates in embodiments of the invention.

For purposes herein, a "semiconductor" is a material or structure that may include an implanted impurity that allows the material to sometimes be conductive and sometimes be a non-conductive, based on electron and hole carrier concentration. As used herein, "implantation processes" can take any appropriate form (whether now known or developed in the future) and can comprise, for example, ion implantation.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to hafnium oxide, aluminum oxide, silicon nitride, silicon oxynitride, a gate dielectric stack of SiO2 and Si3N4, and metal oxides like tantalum oxide that have relative dielectric constants above that of SiO2 (above 3.9). The dielectric can be a combination of two or more of these materials. The thickness of dielectrics herein may vary contingent upon the required device performance. The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

When patterning any material herein, the material to be patterned can be grown or deposited in any known manner and a patterning layer (such as an organic photoresist aka "resist") can be formed over the material. The patterning layer (resist) can be exposed to some form of light radiation (e.g., patterned exposure, laser exposure) provided in a light exposure pattern, and then the resist is developed using a chemical agent. This process changes the characteristic of the portion of the resist that was exposed to the light. Then one portion of the resist can be rinsed off, leaving the other portion of the resist to protect the material to be patterned. A material removal process is then performed (e.g., plasma etching) to remove the unprotected portions of the material to be patterned. The resist is subsequently removed to leave the underlying material patterned according to the light exposure pattern.

For purposes herein, "sidewall structures" are structures that are well-known to those ordinarily skilled in the art and are generally formed by depositing or growing a conformal insulating layer (such as any of the insulators mentioned above) and then performing a directional etching process (anisotropic) that etches material from horizontal surfaces at a greater rate than its removes material from vertical surfaces, thereby leaving insulating material along the vertical sidewalls of structures. This material left on the vertical sidewalls is referred to as a sidewall structure. The sidewall structures can be used as masking structures for further semiconducting processing steps.

Embodiments will be explained below with reference to the accompanying drawings.

FIG. 1 is a cross-sectional diagram depicting the dielectric structure after patterning and etching steps have been performed according to a first embodiment of the invention. Although only a single damascene feature 102 is shown for ease in illustration, the patterned dielectric structure could include a set of vias, a set of trenches, or combination of the same in different embodiments of the invention. An interconnect formed in via is used to conduct current between the device and conductive line layers, or between conductive line layers. An interconnect formed in a trench is part of a conductive line layer which conducts current parallel to the substrate. As is known, a photoresist or sacrificial mandrel layer can be patterned over a dielectric layer. The subsequent etch will create the dielectric structure depicted in FIG. 1.

The dielectric layer 101 is silicon dioxide in preferred embodiments, however, other dielectric materials are used in other embodiments of the invention. Further, the dielectric layer 101 is preferably part of a multilayer structure comprising a plurality of materials.

The single damascene structure 102 shown in FIG. 1 has been etched into the substrate with an aspect ratio (H/D) of height (=H) to width (=D). The example feature 102 illustrated in FIG. 1 could be a via or a trench. In some embodiments of the invention the range of aspect ratios is 0.5 to 20 with aspect ratios of 1 to 10 being preferred. However, in the actual device, there may be high aspect ratios (Height/width) which are greater than 20:1. A typical range of heights of the patterned structure (or depths of the patterned structure) H is from 100 nanometers to 10 micrometers and a typical range of widths of an individual feature D is from 5 nanometers to 1 micrometers.

Figure 2:
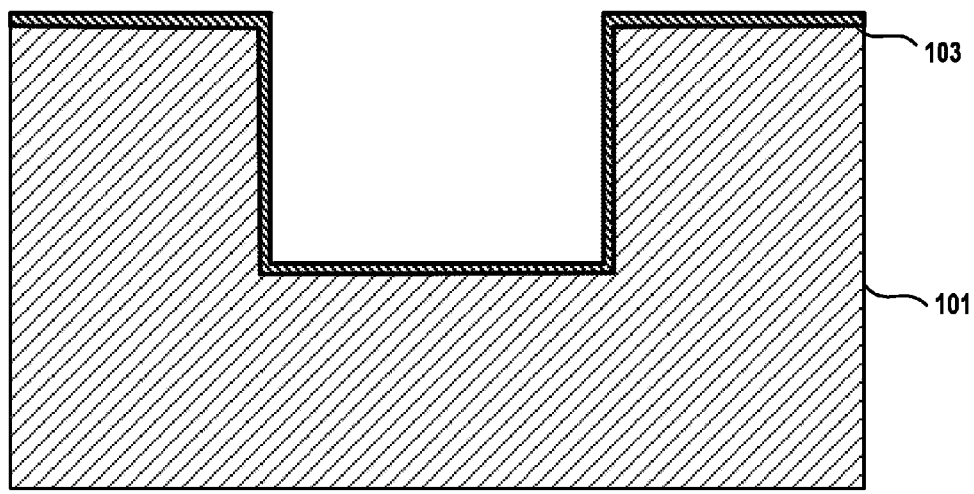
FIG. 2 is a cross-sectional diagram depicting the substrate structure after a liner deposition step has been performed according to a first embodiment of the invention.

FIG. 2 is a cross-sectional diagram depicting the substrate structure after a liner deposition step has been performed according to a first embodiment of the invention. In preferred embodiments of the invention, a liner material selected from the group of Ta, Ti, W, their nitrides or a combination of the same is deposited. The liner material is deposited as a barrier layer 103 over the patterned dielectric layer 101 utilizing any conventional deposition process including, for example, chemical vapor deposition (CVD), plasma enhanced chemical vapor deposition (PECVD), physical vapor deposition (PVD) or sputtering. The thickness of the layer 103 can vary according to the type of layer being formed and the technique used in forming the same. Typically, the layer 103 has a thickness from 1 nm to 100 nm with a thickness from 2 nm to 20 nm being more typical. The liner material 103 prevents the diffusion of the subsequent RuCo metal layer into the dielectric 101, acting also as an adhesion promoting layer so that the RuCo metal layer is bonded to the substrate. Experimental results have shown that direct deposition of Ru on the dielectric produces poor adhesion and causes delamination related reliability problems.

Figure 3:
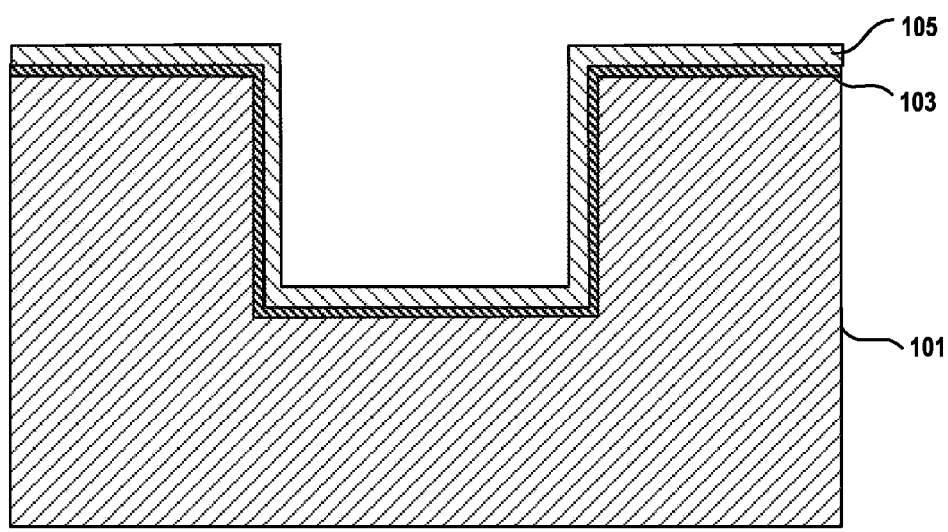
FIG. 3 is a cross-sectional diagram depicting the structure after a ruthenium (Ru) deposition step has been performed according to a first embodiment of the invention.

FIG. 3 is a cross-sectional diagram depicting the structure after a Ru metal deposition step has been performed according to a first embodiment of the invention. The ruthenium layer 105 is formed by a physical vapor deposition (PVD) in a preferred embodiment. The PVD deposition will deposit the Ru layer 105 in higher purities than alternative processes. The ruthenium layer 105 can also be formed by a conventional deposition process including, for example, chemical vapor deposition (CVD), plasma enhanced chemical vapor deposition (PECVD), atomic layer deposition (ALD), sputtering, chemical solution deposition and plating in other embodiments. In preferred embodiments, the thickness of the Ru layer will be sufficient to cover the liner layer 103 and in the range of 1 nm to 100 nm, with a thickness from 2 nm to 20 nm being more typical. As illustrated, the Ru deposition layer 105 is substantially conformal over the liner layer 103, however, a conformal layer is not a requirement of the invention.

Figure 4:
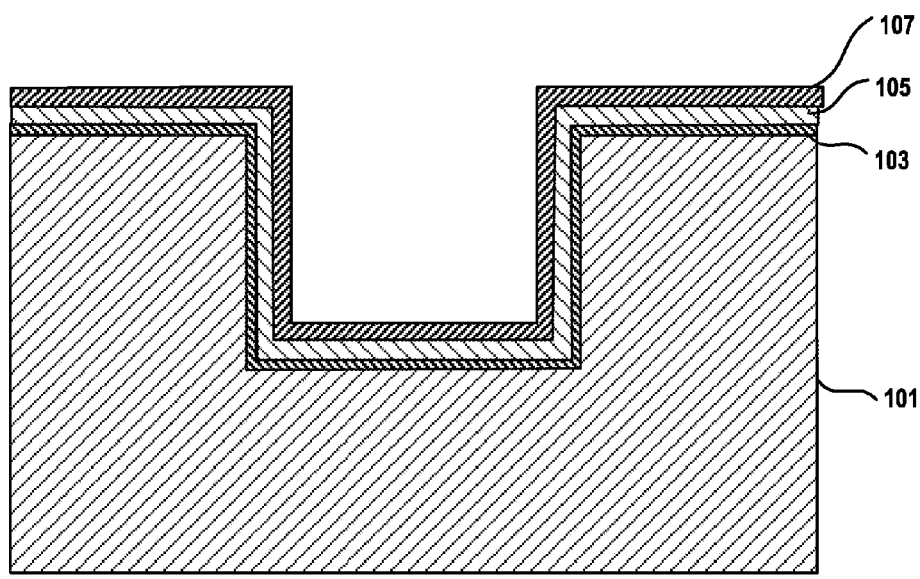
FIG. 4 is a cross-sectional diagram depicting the structure after a cobalt (Co) deposition step has been performed according to a first embodiment of the invention.

FIG. 4 is a cross-sectional diagram depicting the structure after a cobalt (Co) deposition step has been performed according to a first embodiment of the invention. The cobalt layer 107 is formed by a physical vapor deposition (PVD) in a preferred embodiment. The PVD deposition will deposit the Co layer 107 in higher purities than alternative processes. Deposition of cobalt can be also achieved by using other deposition techniques, for example, enhanced atomic layer deposition (ALD), chemical vapor deposition (CVD), sputtering, chemical solution deposition and plating. However, these alternate deposition methods have much greater impurities. For example, empirical data indicates that CVD and ALD depositions have C, Cl, O and S impurities cumulatively in excess of 1000 pm while PVD layers have cumulative deposition less than 200 ppm. In preferred embodiments, the thickness of the Co layer 107 is at least sufficient to cover the Ru layer 105. In preferred embodiments, the thickness of the Co layer 107 will be in the range of 2 nm to 800 nm, with a thickness from 5 nm to 100 nm being more typical. Although as illustrated, the Co deposition layer 107 appears substantially conformal over the Ru layer 105, a PVD deposited film is generally not conformal nor is this a requirement of the invention. The presence of the Ru layer 105 improves the reflow properties of the Co in aggressively scaled features (less than 20 nm) and is expected to improve reliability of the interconnect.

Figure 5:
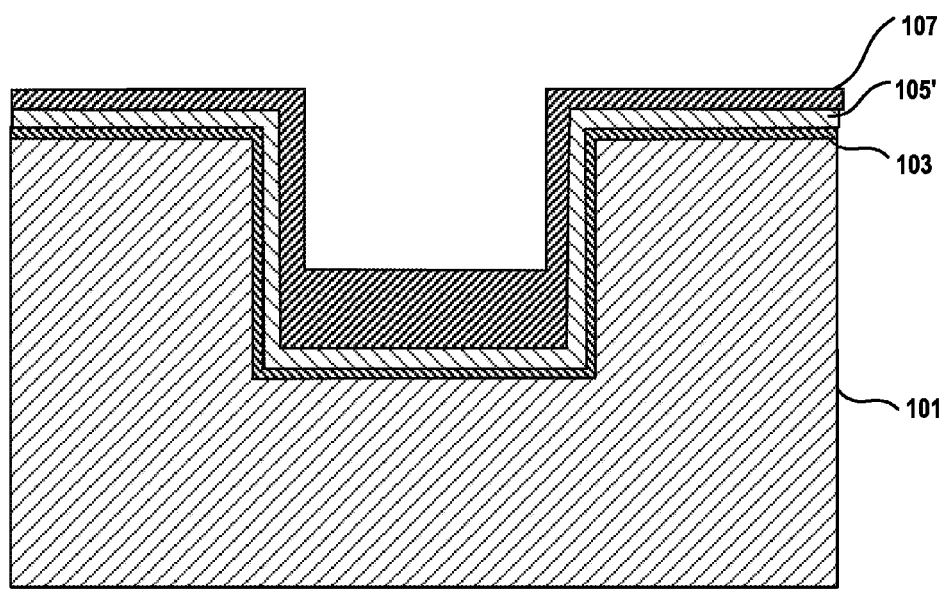
FIG. 5 is a cross-sectional diagram depicting the structure after a thermal anneal step has been performed according to a first embodiment of the invention.

FIG. 5 is a cross-sectional diagram depicting the structure after a thermal anneal step has been performed according to a first embodiment of the invention according to an embodiment of the invention. As shown, the Co has partially filled the feature. Further, a portion of the Co has reacted with the Ru to form a Ru(Co) alloy liner 105' (the numeral has changed from 105 to 105' to indicate the change to an alloy). The Ru underlayer 105 can be either completely converted (as illustrated) to a Ru(Co) alloy liner or only the top surface portion be converted. In one preferred embodiment, the thermal anneal is carried out in a furnace at a high annealing temperature, i.e. over 300 degrees Centigrade. Suitable process conditions include a temperature range between 300-500 degrees Centigrade in a neutral ambient, for example, in an N2, H2, He ambient or a mixture thereof. If carried out in a furnace, the thermal anneal is carried out for a period of 30 minutes to 5 hours in embodiments of the invention. In another embodiment, the thermal anneal is carried out through laser annealing. 20 nanoseconds to 30 minutes, 400-900 degrees Centigrade using a similar ambient. The thickness of the formed Ru(Co) alloy liner can be as thin as 1 Angstroms, which cannot be achieved through a conventional deposition technique. In preferred embodiments of the invention, the liner layer is between 1 A and 10 A, and of high purity from respective PVD depositions of Ru and Co. The maximum thickness of the Ru(Co) alloy layer is dependent on the deposited Ru thickness.

Figure 6:
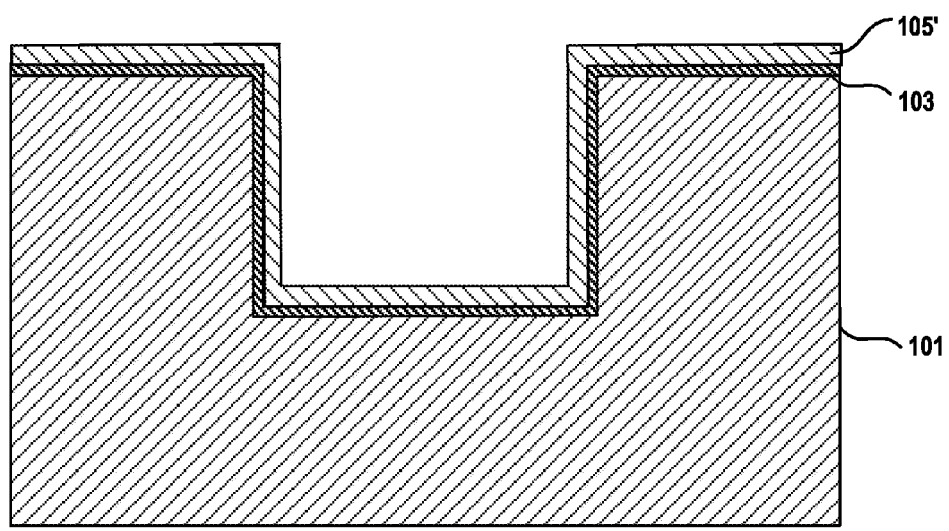
FIG. 6 is a cross-sectional diagram depicting the structure after an etch step has been performed according to a first embodiment of the invention.

FIG. 6 is a cross-sectional diagram depicting the structure after an etch step has been performed according to a first embodiment of the invention. In this step, selective removal of the unreacted cobalt as compared to the Ru(Co) alloy is desired, so the etch process is selected accordingly. Etch processes which could be used in embodiments of the invention include plasma etch processes which include chemical containing fluorine or chlorine, e.g., e.g., $Cl_2$, $F_2$, $C_xF_y$, $SF_6$, $CHF_3$, $CF_xCl_y$, as well as wet etch processes using acids such as hydrogen fluoride, hydrogen chloride, sulfuric acid and nitric acid. The purpose of this removal step is to remove the unreacted cobalt so that it can be replaced in subsequent steps with a metal with a lower resistivity than cobalt at the feature dimensions used for the interconnect.

Figure 7:
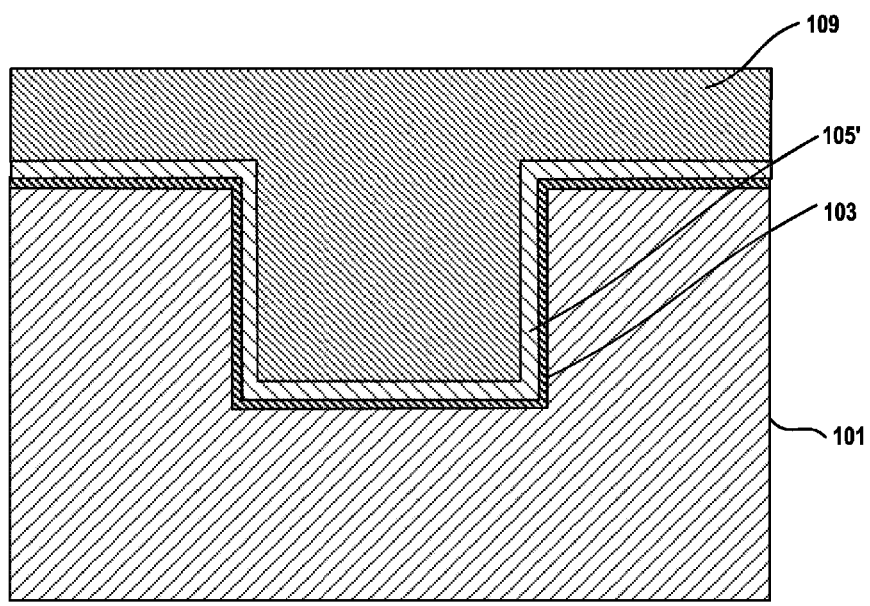
FIG. 7 is a cross-sectional diagram depicting the structure after a metal deposition step has been performed according to a first embodiment of the invention.

FIG. 7 is a cross-sectional diagram depicting the structure after a metal deposition step has been performed according to a first embodiment of the invention. In one preferred embodiment of the invention, a copper layer is deposited. However, in other embodiments of the invention, the metal is selected from the group consisting of Al, Ni, Ir and Rh. The metal is selected to have a lower resistivity than Co at the feature dimensions of the interconnect. The metal layer 109 can be formed by a conventional deposition process including, for example, chemical vapor deposition (CVD), plasma enhanced chemical vapor deposition (PECVD), atomic layer deposition (ALD), physical vapor deposition (PVD), sputtering, chemical solution deposition and plating. In preferred embodiments, the thickness of the second metal layer 109 will be sufficient to fill the feature. In preferred embodiments of the invention, the overburden thickness (the thickness above 107 surface) of the second metal layer 109 is in the range of 100 nm to 900 nm, with a thickness from 300 nm to 600 nm being more typical.

Figure 8:
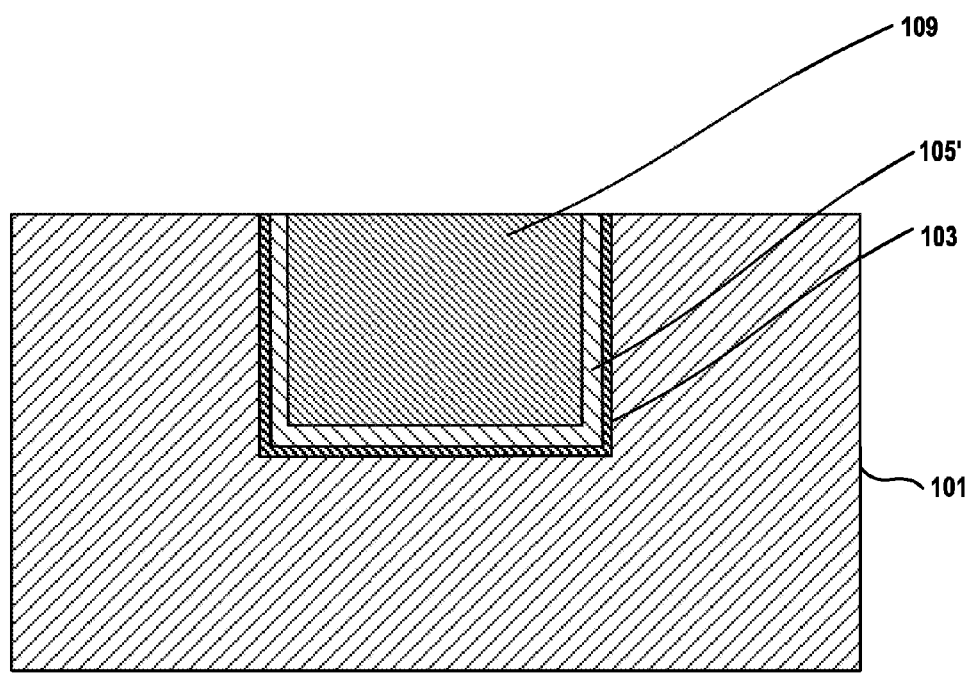
FIG. 8 is a cross-sectional diagram depicting the structure after a planarization step has been performed according to a first embodiment of the invention.

FIG. 8 is a cross-sectional diagram depicting the structure after a planarization step has been performed according to a first embodiment of the invention. The drawing depicts the structure after a planarization process such as a chemical mechanical polishing (CMP) step has been performed according to a first embodiment of the invention. Typically, a CMP process uses an abrasive and corrosive chemical slurry (commonly a colloid) in conjunction with a polishing pad. The pad and wafer are pressed together by a dynamic polishing head and held in place by a plastic retaining ring. As shown, the CMP step has removed the excess portions of the liner layer 103, the Ru(Co) layer 105' and the metal layer 109 in the field areas of the dielectric layer outside the features of the pattern in the dielectric 101. Other planarization processes are known to the art and are used in alternative embodiments of the invention.

Figure 9:
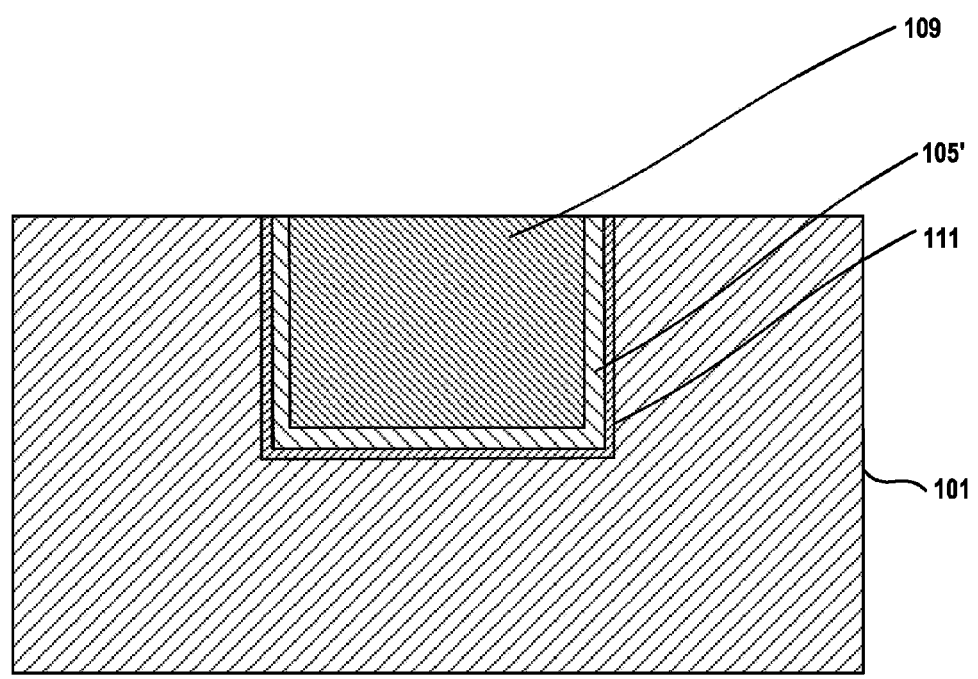
FIG. 9 is a cross-sectional diagram depicting the structure after a planarization step has been performed according to a second embodiment of the invention.

FIG. 9 is a cross-sectional diagram depicting the structure after a planarization step has been performed according to a second embodiment of the invention. This figure corresponds to FIG. 8 which depicts the structure for the first embodiment after a chemical mechanical polishing (CMP) step or other planarization has been performed. In FIG. 9, a nitridized layer 111 replaces the liner layer 103 of FIG. 3. In the drawing, a surface treatment has been performed on the dielectric substrate resulting in a nitridized surface layer 109. The nitridized layer 111 is created on the sidewalls and bottom of the dielectric utilizing a plasma or thermal process which increases the concentration of nitrogen in a surface portion of the dielectric. The nitridation process is performed as a substitute to the deposition of a traditional liner material like that in the first embodiment.

The thermal nitridation process employed in embodiments of the present invention disclosure does not include an electrical bias higher than 200 W in a nitrogen-containing gas or gas mixture. The nitrogen-containing gases that can be employed in the present invention include, but are not limited to, N2, NH3, NH4, NO, and NHx wherein x is between 0 and 1 or mixtures thereof. In some embodiments, the nitrogen-containing gas is used neat, i.e., non-diluted. In other embodiments, the nitrogen-containing gas can be diluted with an inert gas such as, for example, He, Ne, Ar and mixtures thereof. In some embodiments, H2 can be used to dilute the nitrogen-containing gas. The nitrogen-containing gas employed in the present disclosure is typically from 10% to 100%, with a nitrogen content within the nitrogen-containing gas from 50% to 80% being more typical. In one embodiment, the thermal nitridation process employed in the present disclosure is performed at a temperature from 50° C. to 450° C. In another embodiment, the thermal nitridation process employed in the present disclosure is performed at a temperature from 100° C. to 300° C. for 30 minutes to 5 hours. In one set of embodiments, the resulting nitride enhanced layer is between 2 angstroms to 30 angstroms thick, but alternative embodiments can have thicknesses outside this range.

In some embodiments, a N2 plasma process is used to create the nitride layer which involves an electrical bias higher than 350 W. An N2 plasma can be controlled without damaging the dielectric with ion current density range: 50-2000 uA/cm2, and process temperature between 80 and 350 degrees C.

Figure 10:
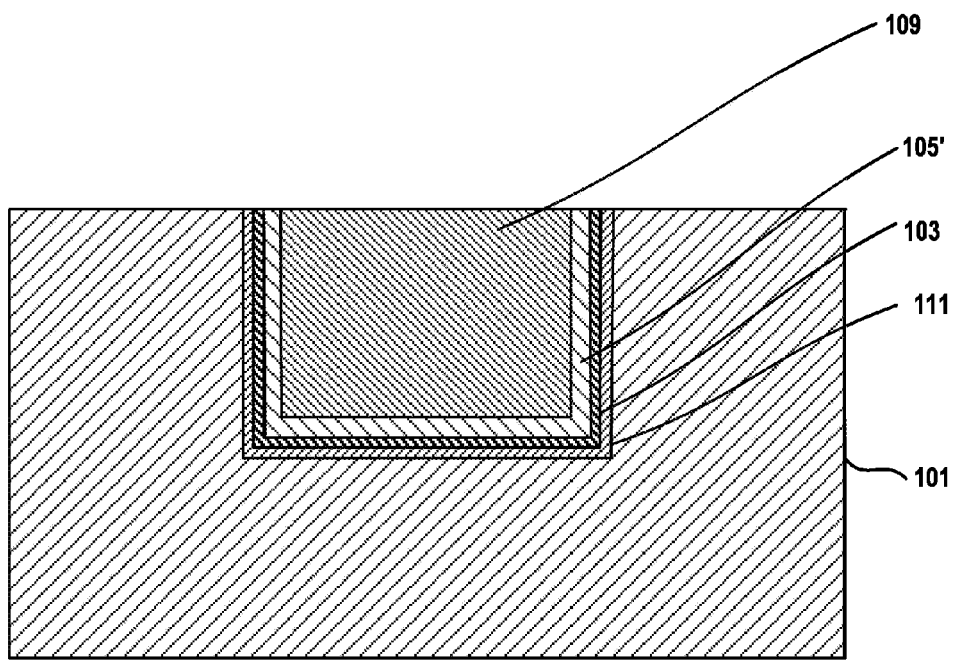
FIG. 10 is a cross-sectional diagram depicting the structure after a planarization step has been performed according to a third embodiment of the invention.

FIG. 10 is a cross-sectional diagram depicting the structure after a planarization step has been performed according to a third embodiment of the invention. The processing is similar to that described above in the first and second embodiments, however, in the third embodiment of the invention, both the enhanced-nitrogen layer 111 and the liner layer 103 are used as adhesion promoting layers. Using both layers 111 and 103 in a structure for extra adhesion between the Ru(Co) layer 105' and the dielectric 101 may be critical for semiconductor products which require high reliability.

Processing of additional layers of the integrated circuit device proceeds after the steps illustrated in the disclosure. For example, a second set of conductive lines could be created using an embodiment of the invention in subsequent steps if required for completion of the integrated circuit.

The resulting structure can be included within integrated circuit chips, which can be distributed by the fabricator in wafer form (that is, as a single wafer that has multiple chips), as a bare die, or in a packaged form. In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While only one or a limited number of features are illustrated in the drawings, those ordinarily skilled in the art would understand that many different types of features could be simultaneously formed with the embodiment herein and the drawings are intended to show simultaneous formation of multiple different types of features. However, the drawings have been simplified to only show a limited number of features for clarity and to allow the reader to more easily recognize the different features illustrated. This is not intended to limit the invention because, as would be understood by those ordinarily skilled in the art, the invention is applicable to structures that include many of each type of feature shown in the drawings.

While the above describes a particular order of operations performed by certain embodiments of the invention, it should be understood that such order is exemplary, as alternative embodiments may perform the operations in a different order, combine certain operations, overlap certain operations, or the like. References in the specification to a given embodiment indicate that the embodiment described may include a particular feature, structure, or characteristic, but every embodiment may not necessarily include the particular feature, structure, or characteristic.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Having described our invention, what we now claim is as follows:

1. A method for fabricating an advanced metal conductor structure comprising:
   providing a pattern in a dielectric layer, wherein the pattern includes a set of features in the dielectric layer for a set of metal conductor structures, the set of features having a first dimension;
   creating an adhesion promoting layer disposed over the patterned dielectric layer;
   depositing a ruthenium layer disposed on the adhesion promoting layer;
   depositing a cobalt layer over the ruthenium layer;
   performing a high temperature thermal anneal which creates a ruthenium cobalt alloy layer to cover surfaces of the set of features; wherein a portion of the cobalt layer is unreacted with the ruthenium layer after the high temperature thermal anneal producing unreacted cobalt;
   etching the unreacted cobalt from the ruthenium cobalt alloy layer; and
   depositing a metal layer disposed on the ruthenium cobalt alloy layer to form the set of metal conductor structures.

2. The method as recited in claim 1, wherein the metal layer comprises a metal having a lower resistivity than cobalt at the first dimension.

3. The method as recited in claim 1, wherein the depositions of ruthenium layer and cobalt layer are performed by a physical vapor deposition process and a thickness of the ruthenium cobalt alloy layer is less than 10 Angstroms.

4. The method as recited in claim 1, wherein the adhesion promoting layer is comprised of a nitrogen enriched layer produced by a nitridation process and a liner layer comprised of one or more materials selected from the group consisting of Ta, Ti, W, TaN, TiN and WN.

5. The method as recited in claim 1, wherein the set of metal conductor structures is a set of conductive lines.

6. The method as recited in claim 1, wherein the high temperature thermal anneal is carried out in a temperature range between 300-800 degrees Centigrade in an $N_2$, $H_2$, He ambient or mixture thereof and the ruthenium cobalt alloy layer is formed.

7. The method as recited in claim 1, further comprising removing excess material on field areas of the dielectric layer using a planarization process.

8. The method as recited in claim 4, wherein the nitridation process is selected from the group of a plasma nitridation process and a thermal nitridation process.

9. The method as recited in claim 1, wherein the metal layer disposed over the ruthenium cobalt alloy layer is a copper layer.

10. The method as recited in claim 1, wherein the etching uses an etching process which is selective to the reacted cobalt as compared to the ruthenium cobalt alloy layer.

11. The method as recited in claim 10, wherein the etching uses a plasma etch process including a chemical containing fluorine or chlorine.

12. The method as recited in claim 1, wherein a thickness of the ruthenium cobalt alloy layer is between one and ten Angstroms.

13. The method as recited in claim 1, wherein the ruthenium layer is completely converted into the ruthenium cobalt alloy layer.

14. The method as recited in claim 1, wherein a portion of the ruthenium layer is unreacted after the high temperature thermal anneal and remains under the ruthenium cobalt layer and directly on the adhesion promoting layer.

15. The method as recited in claim 1, wherein a deposition of the ruthenium layer is conformal.

* * * * *